United States Patent [19]
Bradford

[11] Patent Number: 5,243,536
[45] Date of Patent: Sep. 7, 1993

[54] METHOD AND APPARATUS FOR MEASURING VOLT-AMPS REACTIVE POWER USING SYNTHESIZED VOLTAGE PHASE SHIFT

[75] Inventor: Curtis V. Bradford, Campbell, Calif.

[73] Assignee: Metricom, Inc., Los Gatos, Calif.

[21] Appl. No.: 887,116

[22] Filed: May 20, 1992

Related U.S. Application Data

[63] Continuation of Ser. No. 575,000, Aug. 30, 1990, abandoned.

[51] Int. Cl.$^5$ .................. G06F 15/56; G01R 21/00
[52] U.S. Cl. .................. 364/483; 324/142; 364/492
[58] Field of Search .............. 364/481, 483, 492, 826, 364/725; 324/76 R, 141

[56] References Cited

U.S. PATENT DOCUMENTS

| | | | |
|---|---|---|---|
| 4,595,988 | 6/1986 | Chiffert et al. | 364/483 |
| 4,672,555 | 6/1987 | Hart et al. | 364/483 |
| 4,795,974 | 1/1989 | Landman et al. | 324/142 |
| 4,811,236 | 3/1989 | Brennen et al. | 364/483 |
| 4,884,021 | 11/1989 | Hammond et al. | 364/483 |
| 4,979,122 | 12/1990 | Davis et al. | 364/492 |

FOREIGN PATENT DOCUMENTS

| | | |
|---|---|---|
| 2-75966 | 3/1990 | Japan . |
| 2127992 | 4/1984 | United Kingdom . |

OTHER PUBLICATIONS

Handbook For Electricity Metering publishing by Edison Electric Institute (8th Ed.) Chapter 9, pp. 173-196 (first Ed. 1912 latest Ed. 1981).

Oppenheim et al., "Digital Signal Processing", (Prentice-Hall, 1975), p. 360.

Lopez, R. A., et al., "Reactive Power Meter for Nonsinusoidal Systems", *IEEE Trans. Instrum. Meas.*, vol. IM-26., pp. 258-260 (Sep. 1977).

Krajewski, R. A., "A Formal Aspect of the Difinition of Power", *Measurement*, vol. 8, No. II (Apr.-Jun. 1990).

Czarnecki, L., "One-Ports Which Realize the Hilbert Transformation and Their Application in Reactive Power Meters for Nonsinusoidal Systems", *Archiwum Elektrotechniki*, vol. 33, No. 3-4 (Poland, 1984).

*Primary Examiner*—Kevin J. Teska
*Attorney, Agent, or Firm*—Townsend and Townsend Khourie and Crew

[57] ABSTRACT

In the present invention, true volt-amperes reactive power is measured by sampling instantaneous voltage values of voltage and substantially simultaneously instantaneous values of current of an arbitrary waveform, multiplying the voltage samples by the discrete Hilbert transform (corrected by a sign inversion) to obtain voltage samples of all frequencies shifted by −90° over the bandwidth of the signal of interest and then multiplying this quadrature voltage sample by the corresponding current samples to obtain a true value for VARs, i.e., proportional to the instantaneous volt-amperes reactive power under all conditions. The sampling rate and the period of sampling determine the bandwidth and accuracy of the sampling technique. The invention can be implemented in software or in suitable hardware components capable of sampling and delaying the signal of interest.

22 Claims, 3 Drawing Sheets

METHOD AND APPARATUS FOR MEASURING VOLT-AMPS REACTIVE POWER USING SYNTHESIZED VOLTAGE PHASE SHIFT

CONTINUATION APPLICATION DATA

This application is a continuation application under 37 CFR §1.62 of co-pending patent application Ser. No. 07/575,000, filed Aug. 30, 1990, now abandoned.

BACKGROUND OF THE INVENTION

This invention relates to the accurate measurement of voltage-ampere reactive power (VAR) and more particularly a method and apparatus for measuring VARs in a real world environment where the waveform of interest cannot be accurately approximated as a sinusoid.

Electrical utility system designs are based on the kilovolt-ampere (KVA) load to be served. The KVA load is regarded as the power expended under a given range of power factors. The power factor is defined as the ratio of current drawn by the load to the total current. The total current is defined in terms of kVARs. KVAR metering, or so-called phase-displaced metering, is an attempt to measure voltage and current in quadrature phase relationship to one another, under the assumption that the waveform is sinusoidal (i.e., has no harmonics). The VAR measurement derives from the unit of measurement of magnetizing volt-amperes and is an abbreviation for the phrase "volt-amperes reactive". It is conventionally defined as the voltage times the magnetizing current in amperes.

A theory of power measurement has been developed based on the use of VAR measurements, not all of which is technically correct. Moreover, traditional metering does not yield sufficiently-accurate VAR measurement to permit accurate system design and load management. Traditional measurement techniques involve measuring the current, measuring the voltage at the same time as the current is measured and then delaying the voltage measurements by a time equal to the phase difference of the fundamental frequency. As a consequence, a non-sinusoidal waveform is not accurately depicted and measured by conventional VAR measurement techniques, since a non-sinusoidal waveform contains harmonics of the fundamental which are not properly delayed. As a further consequence, traditional metering techniques may give wildly inaccurate VAR measurements, leading to inconsistent and misleading design and operation decisions, particularly where the voltage and current waveforms are subject to high distortion.

Traditional VAR calculation is described in the *Handbook For Electricity Metering* published by the Edison Electric Institute (8th Ed.) Chapter 9, pp. 173-196 (first Ed. 1912, latest Ed. 1981). Therein is described the traditional VAR metering techniques and theory of operation. It is of interest to note that the method of measurement of electrical quantities is dependent upon the rate, the cost and the required accuracy. What is needed is a metering technique which is highly accurate under all loading conditions.

SUMMARY OF THE INVENTION

According to the invention, true volt-amperes reactive power is measured by sampling instantaneous voltage values of voltage and simultaneously instantaneous values of current of an arbitrary waveform, multiplying the voltage samples by the discrete Hilbert transform (corrected by a sign inversion) to obtain voltage samples of all frequencies shifted by $-90°$ over the bandwidth of the signal of interest and then multiplying this quadrature voltage sample by the corresponding current samples to obtain a true value for VARs, i.e., proportional to the instantaneous volt-amperes reactive power under all conditions. The sampling rate and the period of sampling determine the bandwidth and accuracy of the sampling technique. The invention can be implemented in software or in suitable hardware components capable of sampling and delaying the signal of interest.

The invention will be better understood by reference to the following detailed description in connection with the accompanying drawings.

DESCRIPTION OF THE PREFERRED EMBODIMENTS

Figure 1:
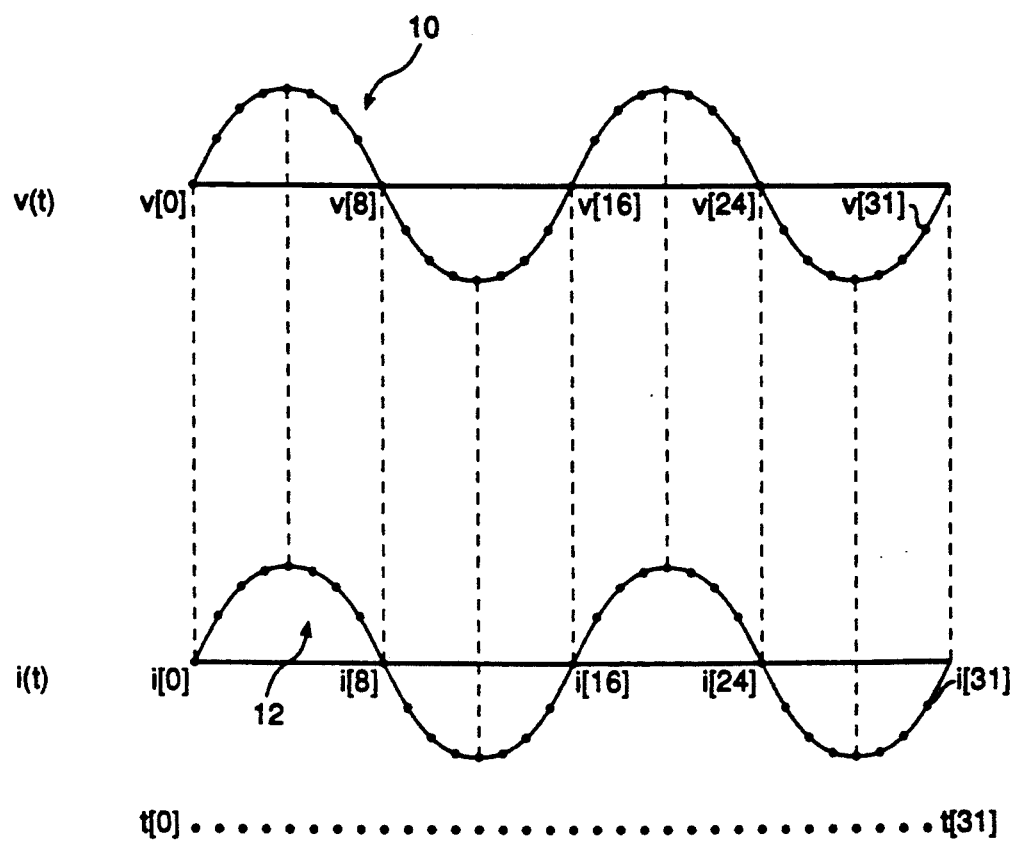
FIG. 1 is a waveform diagram showing voltage as a function of time and current as a function of time for an ideal sinusoidal signal.

Referring to FIG. 1, there is shown a pair of waveforms 10, 12 representing voltage v(t) and current i(t) of an electric power system. In the depiction, the voltage and current are nearly sinusoidal and exhibit no phase difference therebetween. In reality, the waveforms are likely to be distorted, and there may be a phase difference between voltage and current. In accordance with the invention, the voltage and the current are each sampled substantially simultaneously. For example, there is sampling of each waveform at sample times $t=0$ through $t=31$ over a time of two periods of the fundamental frequency of the waveforms.

Figure 2:
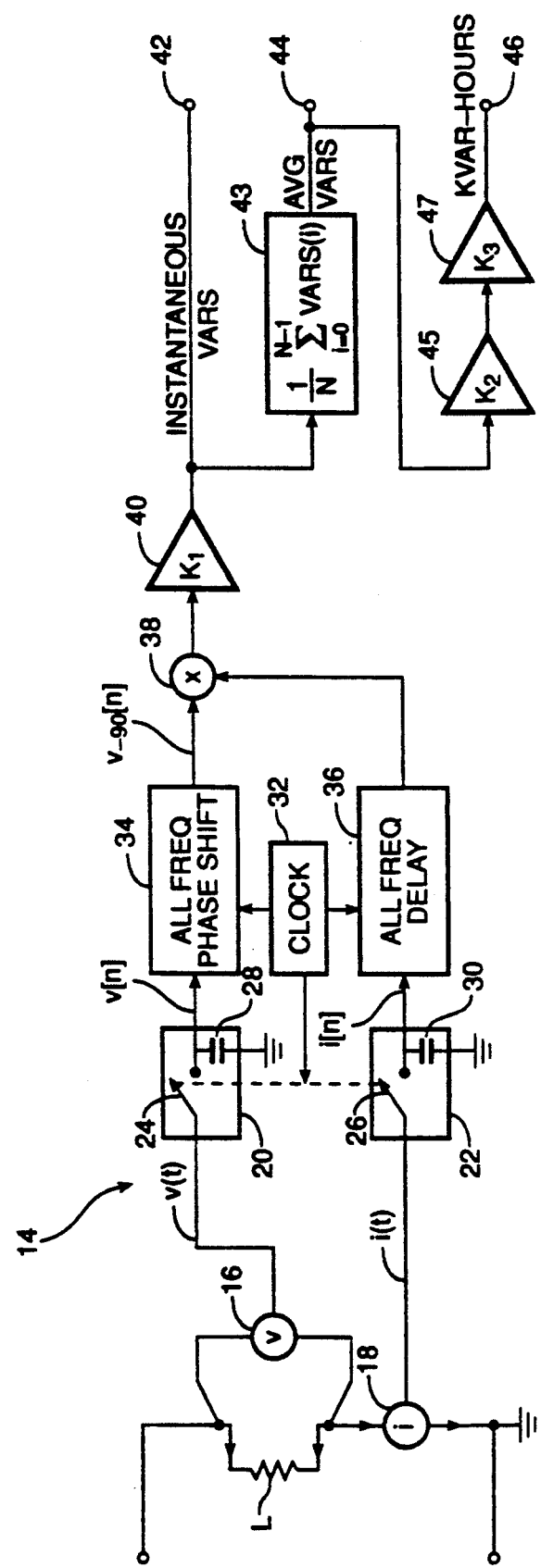
FIG. 2 is a block diagram of a meter according to the invention.

Referring to FIG. 2, there is shown a block diagram of a meter 14 according to the invention. The meter 14 includes a voltmeter 16 across a load of interest L and an ammeter 18 in series with the load L (or coupled in shunt across a known low resistance R in series with the load L) and adapted to measure instanteous voltage and instantaneous current substantially continuously. The meter continuous outputs v(t) and i(t) are applied to sampling circuits 20 and 22, respectively, represented by switches 24, 26 and hold elements 28, 30. The switches are operated synchronously by a clock 32 so that the resultant samples v[n] and i[n] are synchronous and in phase.

The samples v[n] are applied to an all frequency phase shifter 34 according to the invention, as hereinafter explained, and the samples i[n] are time delayed as represented by a sample delay 36 to remain synchronous with the voltage samples v[n].

The output of the all frequency phase shifter 34 is the voltage samples v[n] delayed by 90 degrees, or $v_{-90}[n]$. The samples i[n] and $v_{-90}[n]$ are multiplied together in a multiplier 38, the product of which is scaled through an amplifier 40 by an appropriate gain factor $K_1$, the output of which is the instantaneous VARs 42. The VARs samples are summed over the sampling period N and scaled to obtain the average VARs 44 for the sampling period. KVAR-HOURS 46 is extracted from the instantaneous VARs 42 samples or from the average VARs by appropriate scaling, taking into account the frequency of sampling, the number of samples, the duration of the measurement period and by simply converting VARs to KVARs.

According to the invention, the all frequency phase shifter is a discrete Hilbert transform processor wherein the output is multiplied by negative 1. The coefficients for a simple multiplier realization of such a transform processor are given in Oppenheim and Schafer, *Digital Signal Processing*. (Prentice-Hall, 1975), page 360, FIG. 7.10. The coefficients are taken from the normalized impulse response of an ideal Hilbert transformer over an appropriate period corresponding to the sampling period before and after the instant of interest. In a specific embodiment, the period for sampling is one complete cycle plus one-half cycle before the cycle of interest and on-half cycle after the cycle of interest. The coefficients are the core of a ninety-degree phase shifter. Only odd values of samples are employed with the ninety-degree phase shifter, since the even values correspond to coefficients of value zero. As with any sampled-data system, aliasing of terms is a concern. Accordingly, the bandwidth of interest is selected to eliminate concerns about values aliased into the passband of interest.

The ninety-degree phase shifter is a realization of the following equation:

$$v_{-90}[n] = 3v[n-5] + 5v[n-3] + 15v[n-1] - 15v[n+1] - 5v[n+3] - 3v[n+5] \quad (1)$$

Figure 3:
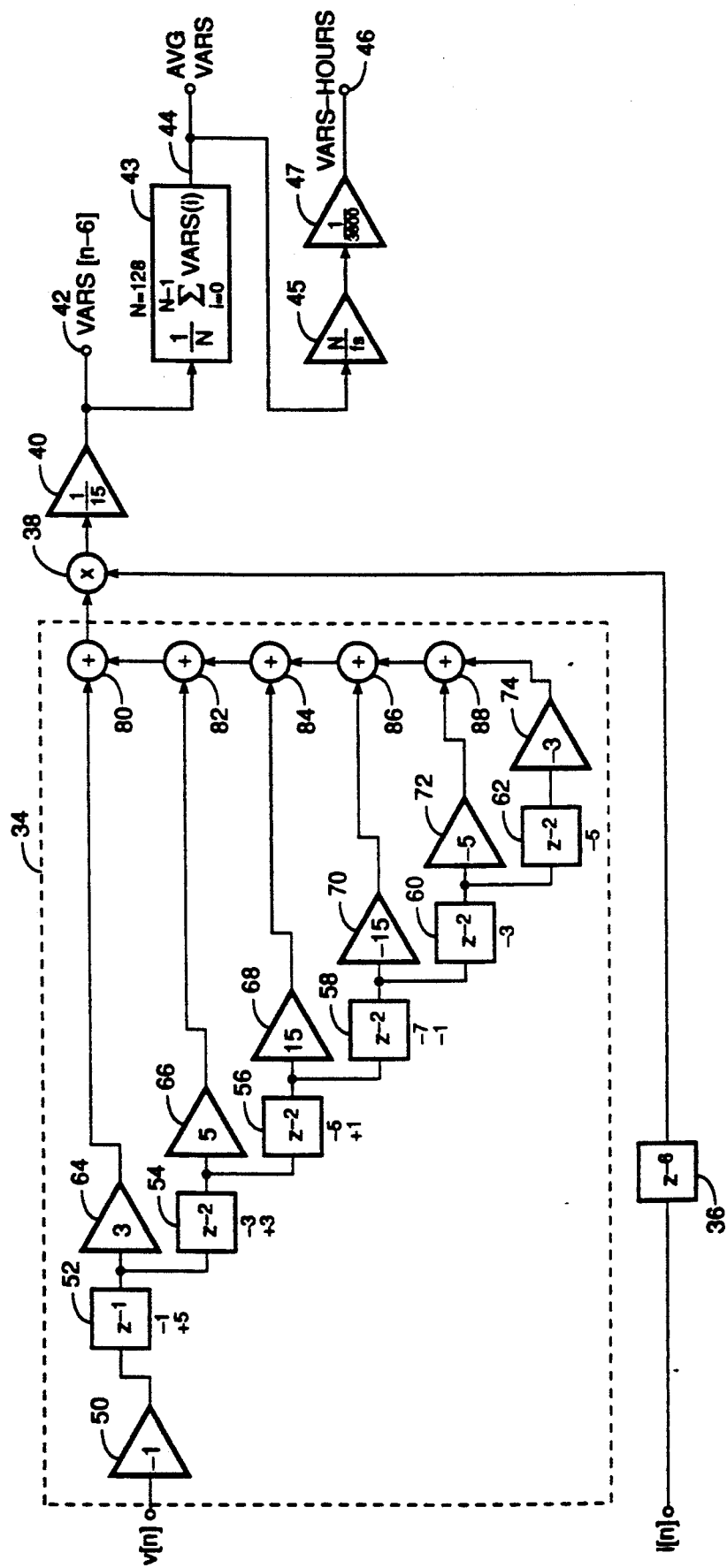
FIG. 3 is a schematic block diagram of an implementation of a meter in accordance with the invention.

The foregoing equation is depicted in FIG. 3 as element 34 which comprises negative 1 multiplier 50, unit delay 52, dual unit delays 54, 56, 58, 60, 62, coefficient multipliers 64, 66, 68, 70, 72, 74, and parallel adders 80, 82, 84, 86, and 88. The all frequency delay 36 is a six unit delay such that multiplier 38 combines the multiplicand and multiplier at the midpoint of the delayed time interval of the ninety degree phase shifter 34. The gain factor of the amplifier $K_1$ is 1/15 to compensate for the integer gain of the coefficient multipliers of element 34. The resultant output at 42 is an accurate representation (within sampling error) of instantaneous VARs delayed by six time units or six sample times. This result compares favorably with any other method of measuring VARs, and it exhibits the same level of accuracy for any waveform exhibiting distortion and having no substantial harmonics above one-half the sampling rate. Although the Hilbert transform is infinite, a representation containing six non-zero coefficients (or equivalently 13 zero and non-zero coefficients) provides adequate precision over the bandwidth of interest.

Other related values are readily derived from the instantaneous VARs measurements. For example, the average VARs for the measurement period, i.e., two seconds or N=128 samples is given by:

$$VARS(avg) = 1/N \sum_{i=0}^{N-1} VARS(i) \quad (2)$$

A suitable adder element 43 (FIG. 2 or FIG. 3) performs this function. The VAR-HOURS is computed from VARS(avg) in accordance with the following relationship:

$$VAR\text{-}HOURS = VARS(avg) (N/f_s) (1/3600) \quad (3)$$

where $f_s$ is the sampling frequency.

Elements 45 and 47 provide the appropriate scaling.

Appendix I, attached hereto and made a part hereof, is a listing of a software implementation of the method according to the invention as applied to a meter having an internal microprocessor capable of performing calculations on values representing sample voltage values and sample current values. This software routine is driven by the interrupts in the system used to acquire samples. The routine performs a portion of its calculation after each sampling in order to distribute the calculation burden of the processor. The result is a calculation which is based on a ninety-degree phase shift for all frequencies of interest. Also included in the routine are calculations of power and other quantities. In calculating power, a random delay is included in the data stream. This is equivalent to randomizing the data samples in order to assure that the steady-state waveform is accurately sampled.

While the invention has been particularly shown and described with reference to preferred embodiments thereof, it will be understood by those skilled in the art that the foregoing and other changes in the form and details may be made therein without departing from the spirit or scope of the invention.

Appendix I

```
PAGINATE
TITLE "sample routine"
PAGEWIDTH 255
MODNAME(sample)
```

--- sample:   This routine is interupt driven off the TOC1-TOC3
          interrupts.
          It's only job is to sample the voltage and current.
          It reads the results of the previous v and i samples,
          and then starts a new conversion to be used next time.
          This way the software does not have to wait around
          for the a/d to finish its conversion.
          It then jumps to the level 1 calculations.

---

```
$INCLUDE "meter.cfg"
$INCLUDE "..\include\control.h"
$INCLUDE "..\include\struc11.inc"
$INCLUDE "..\include\kernel.inc"
```

```
        external      schedule(page0)
        external      scheduling(page0)
        external      tcnt_ext(page0)
        external      porty_mirror(page0)

external      latest_v
        external      latest_i
        external      control
        external      sample_count
        external      start_time
        external      int_mask
        external      sample_period
        external      calc_1_struct_1
        external      calc_1_struct_2
        external      calc_1_struct_3
        external      LB_counter
        external      LBTime
        external      special_LBTime
        external      bat_voltage external      alternate_proc
        external      calculate_1 public  sample_1_interrupt
        public  sample_2_interrupt
        public  sample_3_interrupt ;GLOBALs are mandatory ;PUBLICs are optional - for debugging
        GLOBAL  sample_1_interrupt,sample_2_interrupt,sample_3_interrupt,sample
        GLOBAL  stored_adr1,stored_adr2,stored_adr3,stored_adr4,prev_pointer
        PUBLIC  sample

SEG PAGE0 tored_adr1    ds    1
tored_adr2    ds    1
tored_adr3    ds    1
tored_adr4    ds    1

SEG DATA rev_pointer   ds    2                     ; used to store next business to do

SEG CODE ample PROC

;------------ get voltage and current sample ample_1_interrupt:

..ad_wait1:
        ldaa    ADCTL                  ; wait for previous conversion to finish
        bpl     ..ad_wait1             ; (just in case it didn't finish already ldx     #calc_1_struct_1       ; point to work area ;------------ select both voltage and current to be sampled ldaa    porty_mirror
        anda    #06h                   ; leave other channels' hi/low bits
        oraa    control,x              ; select channel now
        staa    PORTY
        staa    porty_mirror ldaa    #0C1F                  ; load with flag to reset
        staa    TFLG1                  ; reset flag in control register ;------------ compute next sample time ldd     TCNT                   ; get current value of free running coun
        addd    #SAMPLE_PERIOD         ; add sample period to value
```

```
%IF phases_installed EQ 3
        pshd
        ldd     LBTime
        .IF     NZ,OR
                ldd     special_LBTime
        .IF NZ
                puld
                addd    #SAMPLE_PERIOD
        .ELSE
                puld
        .ENDIF
%ENDIF
        std     TOC1                    ; store into timer control register ------------ if sample count = 0 then read counter and store as start time
             (this timestamps the first sample of the set of 32)

.IF <ZERO,<sample_count,x>>
                ldd     LB_counter
                std     start_time,x
                ldd     LB_counter+2
                std     start_time+2,x
        .ENDIF ------------ start next a/d conversion .start_ad:

ldd     ADR1                    ; first store previous results
        std     stored_adr1
        ldd     ADR3
        std     stored_adr3 ldaa    #10h                    ; start a/d conversion on inputs AN0-AN3
        staa    ADCTL ------------ jump to business ldy     prev_pointer xgdx                            ; exchange x and y
        xgdy
        xgdx
        sty     prev_pointer            ; store for next time ------------ if x = 0 or 1 then do alternate processing .IF <x,LS,#1>
                jmp     alternate_proc
        .ENDIF ------------ else do sampling routine ------------ get results of last of a/d conversion ample_process:
        ldaa    int_mask,x              ; turn of sample interrupt while in calc
        coma
        anda    TMSK1
        staa    TMSK1 clrb                            ; clear b for use before carry created ldaa    stored_adr1             ; get first of 2 voltage samples
        adda    stored_adr3             ; add to second voltage sample
        rolb                            ; put carry bit into b reg staa    latest_v+1,x            ; store lower byte of voltage result
        stab    latest_v,x              ; store upper byte of voltage result
```

```
        ldaa    stored_adr2             ; get current sample
        staa    latest_i,x              ; store current result ; ------------ goto calculate 1 routine inc     scheduling              ; we may want to schedule later ENABLE                          ; turn interrupts back on jmp     calculate_1             ; continue with calc 1 routine sample ENDPROC end $PAGINATE
$TITLE "calculate_1 routine"
$PAGEWIDTH 255
$MODNAME(calc1)

; ----------------------------------------------------------------------
; calculate_1:           This routine is driven from the sample interrupts.
;                        This same routine runs for up to three channels.
;                        It takes the raw samples and validates the I sample
;                        and then performs the first level of calculations
;                        upon these samples.
;                        These level 1 calculations create sums using groups
;                        of 32 samples. These samples have indexes 0 to 31.
;                        When these sums are full it notifies the level 2
;                        calculations task and exits to dispatcher.
;                        It produces 8 samples of instantaneous quadrature
;                        voltage and multiplies them by 8 instantaneous
;                        current samples to produce 8 instantaneous vars
;                        calculations. It then adds them to produce VAR_SUM.
; ----------------------------------------------------------------------

%INCLUDE "meter.cfg"
        %INCLUDE "..\include\control.h"
        %INCLUDE "..\include\kernel.inc"
        %INCLUDE "..\include\strucl1.inc"

external        schedule(page0)
        external        scheduling(page0)
        external        tcnt_ext(page0)

external        FieldTest_Time
        external        LB_DeltaTime
        external        LB_RealDelta
        external        LB_counter
        external        LB_StartTime
        external        LB_LEDcounter
        external        LBTime
        external        Pulses_test
        external        special_LBTime external        calc_2_task1
        external        calc_2_task2
        external        calc_2_task3
        external        dispatch
        external        PostTask
        external        LB_Init external        MAX2_COUNT
        external        LED_ON $ALLPUBLIC HI_LIMIT        EQU     0FCH
LOW_LIMIT       EQU     04H
HI_RANGE        EQU     6

CHANNEL_TEMP    EQU     00100000B
```

```
; ------------ work area offsets

POWER_SUM       EQU     00H
        V_DC_SUM        EQU     POWER_SUM+3
        I_DC_SUM        EQU     V_DC_SUM+2
        V_RMS_SUM       EQU     I_DC_SUM+2
        VAR_SUM         EQU     V_RMS_SUM+3
        VR_RMS_SUM      EQU     VAR_SUM+3
        I_RANGE         EQU     VR_RMS_SUM+4
        START_TIME      EQU     I_RANGE+1
        ORIG_START_TIME EQU     START_TIME+4
        FALSE_START     EQU     ORIG_START_TIME+4
        power2_sum      equ     false_start+1
        v_dc2_sum       equ     power2_sum+4
        i_dc2_sum       equ     v_dc2_sum+3
        v_rms2_sum      equ     i_dc2_sum+3
        var2_sum        equ     v_rms2_sum+4
        vr_rms2_sum     equ     var2_sum+4
        sum2_count      equ     vr_rms2_sum+5
        i_range0        equ     sum2_count+1
        prev_start_time equ     i_range0+1
        done_flag       equ     prev_start_time+4
        LB_tword        equ     done_flag+1
        LB_float1       equ     LB_tword+6
        LBdc_power      equ     LB_float1
        LB_float2       equ     LB_float1+3
        LB_float3       equ     LB_float2+3
        LB_accum        equ     LB_float3+3
        LB_count        equ     LB_accum+5
        CALC_2_STRUCT_SIZE  EQU LB_count+2

IR_SAVE         EQU     FALSE_START+1
        VR_SUM          EQU     IR_SAVE+8
        SAMPLE_COUNT    EQU     VR_SUM+16
        TEMP_STORE      EQU     SAMPLE_COUNT+1
        SIGN_FLAG       EQU     TEMP_STORE+2
        GAIN_TABLE      EQU     SIGN_FLAG+1
        XFER_ADDRESS    EQU     GAIN_TABLE+2
        LATEST_V        EQU     XFER_ADDRESS+2
        LATEST_I        EQU     LATEST_V+2
        CONTROL         EQU     LATEST_I+1
        int_mask        equ     control+1
        v_samples       equ     int_mask+1
        ;CALC_1_STRUCT_SIZE  EQU int_mask+1
        CALC_1_STRUCT_SIZE  equ v_samples+64 power3_sum      equ     0
        v_dc3_sum       equ     power3_sum+4
        i_dc3_sum       equ     v_dc3_sum+3
        v_rms3_sum      equ     i_dc3_sum+3
        var3_sum        equ     v_rms3_sum+4
        vr_rms3_sum     equ     var3_sum+4
        i_range3        equ     vr_rms3_sum+5
        sum3_count      equ     i_range3+1
        delta_time      equ     sum3_count+1
        calc_3_struct_size  equ delta_time+4

SEG PAGE0
        porty_mirror    ds      1

; ------------ define work areas

SEG DATA calc_1_struct_1 ds      calc_1_struct_size  ; level 1 work area
        calc_2_struct_1 ds      calc_2_struct_size  ; level 2 work area
        calc_3_struct_1 ds      calc_3_struct_size  ; level 3 work area calc3_work_1    ds      calc_3_struct_size  ; temporary save area of level 3

$NOALLPUBLIC

SEG CODE

;GLOBALs are mandatory ;PUBLICs are optional - for debugging
            GLOBAL  calculate_1,gain_table1,gain_table2,gain_table3
            GLOBAL  xfer1,xfer2,xfer3
```

```
        PUBLIC  count0,count_even,count3,count5,count7,count9,count11
        PUBLIC  count13,count15,count17,count19,count21,count23,count25
        PUBLIC  count27,count31,cont31,count_nop
        PUBLIC  exit_calc1,calc_1_jumps calculate_1 PROC ; ------------ validate I sample ldaa    latest_i,x              ; load latest I sample ; ------------ if I sample is invalid then goto next higher I range .IF <a,HI,#HI_LIMIT>,OR         ; if I sample is greater than hi limit o
        .IF <a,LO,#LOW_LIMIT>           ; than lower limit then sample is invali
                ldab    i_range,x       ; load b with current I range .IF <b,NE,#HI_RANGE>    ; if I range is not max then increase
                                        ; to next higher range
                        incb            ; increase range stab    I_RANGE,x       ; store new range number ldy     gain_table,x
                        aby                     ; index into lookup table ldaa    0,y             ; get new gain settings
                        staa    control,x       ; store new value of control byt clr     sample_count,x  ; set sample count back to zero .IF <ZERO,<false_start,x>>      ; only set to false once
                                ldaa    #0ffh           ; set to false start
                                staa    false_start,x ldd     start_time,x    ; save original start ti
                                std     orig_start_time,x
                                ldd     start_time+2,x
                                std     orig_start_time+2,x
                        .ENDIF jmp     exit_calc1      ; exit routine
                .ENDIF
        .ENDIF ; ------------ jump to processing to be done based on sample index (0 - 31)

ldy     #calc_1_jumps           ; point to top of jump table
        ldab    sample_count,x          ; get sample count
        lslb                            ; make 2 byte index
        aby
        ldy     0,y                     ; load address of code into y
        jmp     0,y                     ; jump to calc code ; ------------ come here if sample count = {0,2,4,...,30} count_even:

; ------------ if sample count is 8 to 22 then store current I sample ldab    SAMPLE_COUNT,x          ; load present value of sample count .IF <b,GE,#8>,AND
        .IF <b,LE,#22>
                subb    #8              ; make sample count into index for stora
                lsrb ldaa    LATEST_I,x      ; get current value of I pshx                    ; save contents of x
                abx                     ; add index
```

```
                staa    IR_SAVE,x           ; save I sample for vars calculation
                pulx                        ; recover value of x
        .ENDIF inc     SAMPLE_COUNT,x      ; increment sample count jmp     exit_calc1          ; exit routine ; ------------ come here if sample count = ( 3 )

count3:
                ldd     LATEST_V,x          ; load latest voltage sample lsld                        ; multiply by 3
                addd    LATEST_V,x std     VR_SUM,x            ; store into VR_SUM[0]

inc     SAMPLE_COUNT,x      ; increment sample count jmp     exit_calc1          ; exit routine ; ------------ come here if sample count = ( 5 )

count5:
                ldd     LATEST_V,x          ; load latest voltage sample
                lsld                        ; multiply by 3
                addd    LATEST_V,x std     VR_SUM+2,x          ; store into VR_SUM[1]

ldd     LATEST_V,x          ; multiply voltage sample by 5
                lsld
                lsld
                addd    LATEST_V,x addd    VR_SUM,x            ; add to VR_SUM[0]
                std     VR_SUM,x inc     SAMPLE_COUNT,x      ; increment sample count jmp     exit_calc1          ; exit routine ; ------------ come here if sample count = ( 7 )

count7:
                ldd     LATEST_V,x          ; multiply voltage sample by 3
                lsld
                addd    LATEST_V,x std     VR_SUM+4,x          ; store into VR_SUM[2]

ldd     LATEST_V,x          ; multiply voltage sample by 5
                lsld
                lsld
                addd    LATEST_V,x addd    VR_SUM+2,x          ; add to VR_SUM[1]
                std     VR_SUM+2,x ldd     LATEST_V,x          ; multiply voltage sample by 15
                lsld
                lsld
                lsld
                lsld
                subd    LATEST_V,x addd    VR_SUM,x            ; add to VR_SUM[0]
                std     VR_SUM,x inc     SAMPLE_COUNT,x      ; increment sample count jmp     exit_calc1          ; exit routine
```

; ------------ come here if sample count = ( 9 )

count9:
```
        ldd     LATEST_V,x              ; multiply voltage sample by 3
        lsld
        addd    LATEST_V,x std     VR_SUM+6,x              ; store into VR_SUM[3]

ldd     LATEST_V,x              ; multiply voltage sample by 5
        lsld
        lsld
        addd    LATEST_V,x addd    VR_SUM+4,x              ; add to VR_SUM[2]
        std     VR_SUM+4,x ldd     LATEST_V,x              ; multiply voltage sample by 15
        lsld
        lsld
        lsld
        lsld
        subd    LATEST_V,x std     TEMP_STORE,x            ; save this in temp storage
        addd    VR_SUM+2,x              ; add to VR_SUM[1]
        std     VR_SUM+2,x ldd     VR_SUM,x                ; subtract v * 15 from VR_SUM[0]
        subd    TEMP_STORE,x
        std     VR_SUM,x inc     SAMPLE_COUNT,x          ; increment sample count jmp     exit_calc1              ; exit routine
```

; ------------ come here if sample count = ( 11 )

count11:
```
        ldd     LATEST_V,x              ; multiply voltage sample by 3
        lsld
        addd    LATEST_V,x std     VR_SUM+8,x              ; store into VR_SUM[4]

ldd     LATEST_V,x              ; multiply voltage sample by 5
        lsld
        lsld
        addd    LATEST_V,x
        std     TEMP_STORE,x            ; save in temporary storage addd    VR_SUM+6,x              ; add to VR_SUM[3]
        std     VR_SUM+6,x ldd     VR_SUM,x                ; subtract from VR_SUM[0]
        subd    TEMP_STORE,x
        std     VR_SUM,x ldd     LATEST_V,x              ; multiply voltage sample by 15
        lsld
        lsld
        lsld
        lsld
        subd    LATEST_V,x
        std     TEMP_STORE,x            ; save this in temp storage addd    VR_SUM+4,x              ; add to VR_SUM[2]
        std     VR_SUM+4,x ldd     VR_SUM+2,x              ; subtract from VR_SUM[1]
        subd    TEMP_STORE,x
        std     VR_SUM+2,x inc     SAMPLE_COUNT,x          ; increment sample count
```

```
                jmp     exit_calc1              ; exit routine

; ------------ come here if sample count = ( 13 )

count13:
        ldd     LATEST_V,x              ; multiply voltage sample by 3
        lsld
        addd    LATEST_V,x std     VR_SUM+10,x             ; store into VR_SUM[5]

clr     SIGN_FLAG,x             ; clear sign flag ldd     VR_SUM,x                ; subtract from VR_SUM[0]
        subd    VR_SUM+10,x             ; this finishes VR_SUM[0]
        std     VR_SUM,x                ; store for debug ; ------------ if negative make positive for multiply .IF MI                          ; if result is negative then make positi
                coma                    ; make 2's complement
                comb
                addd    #1
                com     SIGN_FLAG,x     ; set flag to indicate minus result
        .ENDIF ; ------------ multiply VR_SUM[0] * IR_SAVE[0] and add to VAR_SUM DISABLE                         ; disable interupts for multiply std     X_WORD                  ; do multiply
        ldab    IR_SAVE,x               ; get the saved I sample for vars calc
        clra
        std     Y_WORD                  ; multiply by VR_SUM[0]
        .IF <PLUS,<SIGN_FLAG,x>>        ; check sign of VR_SUM ldd     Y_WORD          ; store product into VAR_SUM
                std     VAR_SUM+1,x
                ldaa    X_WORD+1
                staa    VAR_SUM,x
        .ELSE
                ldd     #0              ; store opposite of VAR_SUM
                subd    Y_WORD
                std     VAR_SUM+1,x
                ldaa    #0
                sbca    X_WORD+1
                staa    VAR_SUM,x
        .ENDIF ENABLE                          ; re-enable interupts ldd     LATEST_V,x              ; multiply voltage sample by 5
        lsld
        lsld
        addd    LATEST_V,x
        std     TEMP_STORE,x            ; save in temporary storage addd    VR_SUM+8,x              ; add to VR_SUM[4]
        std     VR_SUM+8,x ldd     VR_SUM+2,x              ; subtract from VR_SUM[1]
        subd    TEMP_STORE,x
        std     VR_SUM+2,x ldd     LATEST_V,x              ; multiply voltage sample by 15
        lsld
        lsld
        lsld
        lsld
        subd    LATEST_V,x
        std     TEMP_STORE,x            ; save this in temp storage
```

```
        addd    VR_SUM+6,x              ; add to VR_SUM[3]
        std     VR_SUM+6,x
        ldd     VR_SUM+4,x              ; subtract from VR_SUM[2]
        subd    TEMP_STORE,x
        std     VR_SUM+4,x inc     SAMPLE_COUNT,x          ; increment sample count jmp     exit_calc1              ; exit routine ; ------------ come here if sample count = ( 15 )

count15:
        ldd     LATEST_V,x              ; multiply voltage sample by 3
        lsld
        addd    LATEST_V,x std     VR_SUM+12,x             ; store into VR_SUM[6]

clr     SIGN_FLAG,x             ; clear sign flag ldd     VR_SUM+2,x              ; subtract from VR_SUM[1]
        subd    VR_SUM+12,x             ; this finishes VR_SUM[1]
        std     VR_SUM+2,x              ; store for debug ; ------------ if negative make positive for multiply .IF MI                          ; if result is negative then make positi
                coma                    ; make 2's complement
                comb
                addd    #1
                com     SIGN_FLAG,x     ; set flag to indicate minus result
        .ENDIF ; ------------ multiply VR_SUM[1] * IR_SAVE[1] and add to VAR_SUM DISABLE                         ; disable interupts for multiply std     X_WORD
        ldab    IR_SAVE+1,x             ; get the saved I sample for vars calc
        clra
        std     Y_WORD                  ; multiply by VR_SUM[1]

.IF <PLUS,<SIGN_FLAG,x>>        ; check sign of VR_SUM ldd     VAR_SUM+1,x     ; add product into VAR_SUM
                addd    Y_WORD
                std     VAR_SUM+1,x
                ldaa    VAR_SUM,x
                adca    X_WORD+1
                staa    VAR_SUM,x
        .ELSE
                ldd     VAR_SUM+1,x     ; subtract product from VAR_SUM
                subd    Y_WORD
                std     VAR_SUM+1,x
                ldaa    VAR_SUM,x
                sbca    X_WORD+1
                staa    VAR_SUM,x
        .ENDIF ENABLE                          ; re-enable interupts ldd     LATEST_V,x              ; multiply voltage sample by 5
        lsld
        lsld
        addd    LATEST_V,x
        std     TEMP_STORE,x            ; save in temporary storage addd    VR_SUM+10,x             ; add to VR_SUM[5]
        std     VR_SUM+10,x
```

```
        ldd     VR_SUM+4,x              ; subtract from VR_SUM[2]
        subd    TEMP_STORE,x
        std     VR_SUM+4,x ldd     LATEST_V,x              ; multiply voltage sample by 15
        lsld
        lsld
        lsld
        lsld
        subd    LATEST_V,x
        std     TEMP_STORE,x            ; save this in temp storage addd    VR_SUM+8,x              ; add to VR_SUM[4]
        std     VR_SUM+8,x ldd     VR_SUM+6,x              ; subtract from VR_SUM[3]
        subd    TEMP_STORE,x
        std     VR_SUM+6,x inc     SAMPLE_COUNT,x          ; increment sample count jmp     exit_calc1              ; exit routine ; ------------- come here if sample count = ( 17 )

count17:
        ldd     LATEST_V,x              ; multiply voltage sample by 3
        lsld
        addd    LATEST_V,x std     VR_SUM+14,x             ; store into VR_SUM[7]

clr     SIGN_FLAG,x             ; clear sign flag ldd     VR_SUM+4,x              ; subtract from VR_SUM[2]
        subd    VR_SUM+14,x             ; this finishes VR_SUM[2]
        std     VR_SUM+4,x              ; store for debug ; ------------- if negative make positive for multiply .IF MI                          ; if result is negative then make positi
            coma                        ; make 2's complement
            comb
            addd    #1
            com     SIGN_FLAG,x         ; set flag to indicate minus result
        .ENDIF ; ------------- multiply VR_SUM[2] * IR_SAVE[2] and add to VAR_SUM DISABLE                         ; disable interupts for multiply std     X_WORD
        ldab    IR_SAVE+2,x             ; get the saved I sample for vars calc
        clra
        std     Y_WORD                  ; multiply by VR_SUM[2]

.IF <PLUS,<SIGN_FLAG,x>>        ; check sign of VR_SUM
            ldd     VAR_SUM+1,x         ; add product into VAR_SUM
            addd    Y_WORD
            std     VAR_SUM+1,x
            ldaa    VAR_SUM,x
            adca    X_WORD+1
            staa    VAR_SUM,x
        .ELSE
            ldd     VAR_SUM+1,x         ; subtract product from VAR_SUM
            subd    Y_WORD
            std     VAR_SUM+1,x
            ldaa    VAR_SUM,x
            sbca    X_WORD+1
            staa    VAR_SUM,x
        .ENDIF
```

```
        ENABLE                          ; re-enable interupts ldd     LATEST_V,x              ; multiply voltage sample by 5
        lsld
        lsld
        addd    LATEST_V,x
        std     TEMP_STORE,x            ; save in temporary storage addd    VR_SUM+12,x             ; add to VR_SUM[6]
        std     VR_SUM+12,x ldd     VR_SUM+6,x              ; subtract from VR_SUM[3]
        subd    TEMP_STORE,x
        std     VR_SUM+6,x ldd     LATEST_V,x              ; multiply voltage sample by 15
        lsld
        lsld
        lsld
        lsld
        subd    LATEST_V,x
        std     TEMP_STORE,x            ; save this in temp storage addd    VR_SUM+10,x             ; add to VR_SUM[5]
        std     VR_SUM+10,x ldd     VR_SUM+8,x              ; subtract from VR_SUM[4]
        subd    TEMP_STORE,x
        std     VR_SUM+8,x inc     SAMPLE_COUNT,x          ; increment sample count jmp     exit_calc1              ; exit routine ; ------------ come here if sample count = ( 19 )

count19:
        ldd     LATEST_V,x              ; multiply voltage sample by 3
        lsld
        addd    LATEST_V,x std     TEMP_STORE,x            ; store into temp storage clr     SIGN_FLAG,x             ; clear sign flag ldd     VR_SUM+6,x              ; subtract from VR_SUM[3]
        subd    TEMP_STORE,x            ; this finishes VR_SUM[3]
        std     VR_SUM+6,x              ; store for debug ; ------------ if negative then make positive for multiply .IF MI                          ; if result is negative then make positi
                coma                    ; make 2's complement
                comb
                addd    #1
                com     SIGN_FLAG,x     ; set flag to indicate minus result
        .ENDIF ; ------------ multiply VR_SUM[3] * IR_SAVE[3] and add to VAR_SUM DISABLE                         ; disable interupts for multiply std     X_WORD
        ldab    IR_SAVE+3,x             ; get the saved I sample for vars calc
        clra
        std     Y_WORD                  ; multiply by VR_SUM[3]

.IF <PLUS,<SIGN_FLAG,x>>        ; check sign of VR_SUM ldd     VAR_SUM+1,x     ; add product into VAR_SUM
                addd    Y_WORD
                std     VAR_SUM+1,x
```

```
            ldaa    VAR_SUM,x
            adca    X_WORD+1
            staa    VAR_SUM,x
    .ELSE
            ldd     VAR_SUM+1,x     ; subtract product from VAR_SUM
            subd    Y_WORD
            std     VAR_SUM+1,x
            ldaa    VAR_SUM,x
            sbca    X_WORD+1
            staa    VAR_SUM,x
    .ENDIF ENABLE                          ; re-enable interupts ldd     LATEST_V,x      ; multiply voltage sample by 5
            lsld
            lsld
            addd    LATEST_V,x
            std     TEMP_STORE,x    ; save in temporary storage addd    VR_SUM+14,x     ; add to VR_SUM[7]
            std     VR_SUM+14,x ldd     VR_SUM+8,x      ; subtract from VR_SUM[4]
            subd    TEMP_STORE,x
            std     VR_SUM+8,x ldd     LATEST_V,x      ; multiply voltage sample by 15
            lsld
            lsld
            lsld
            lsld
            subd    LATEST_V,x
            std     TEMP_STORE,x    ; save this in temp storage addd    VR_SUM+12,x     ; add to VR_SUM[6]
            std     VR_SUM+12,x ldd     VR_SUM+10,x     ; subtract from VR_SUM[5]
            subd    TEMP_STORE,x
            std     VR_SUM+10,x inc     SAMPLE_COUNT,x  ; increment sample count jmp     exit_calc1      ; exit routine ; ------------ come here if sample count = ( 21 )

count21:
            ldd     LATEST_V,x      ; multiply voltage sample by 3
            lsld
            addd    LATEST_V,x std     TEMP_STORE,x    ; store into temp storage clr     SIGN_FLAG,x     ; clear sign flag ldd     VR_SUM+8,x      ; subtract from VR_SUM[4]
            subd    TEMP_STORE,x    ; this finishes VR_SUM[4]
            std     VR_SUM+8,x      ; store for debug ; ------------ if negative then make positive for multiply .IF MI                          ; if result is negative then make positi
            coma                    ; make 2's complement
            comb
            addd    #1
            com     SIGN_FLAG,x     ; set flag to indicate minus result
    .ENDIF ; ------------ multiply VR_SUM[4] * IR_SAVE[4] and add to VAR_SUM
```

```
        DISABLE                             ; disable interupts for multiply std     X_WORD
        ldab    IR_SAVE+4,x                 ; get the saved I sample for vars calc
        clra
        std     Y_WORD                      ; multiply by VR_SUM[4]

.IF <PLUS,<SIGN_FLAG,x>>            ; check sign of VR_SUM ldd     VAR_SUM+1,x         ; add product into VAR_SUM
                addd    Y_WORD
                std     VAR_SUM+1,x
                ldaa    VAR_SUM,x
                adca    X_WORD+1
                staa    VAR_SUM,x
        .ELSE
                ldd     VAR_SUM+1,x         ; subtract product from VAR_SUM
                subd    Y_WORD
                std     VAR_SUM+1,x
                ldaa    VAR_SUM,x
                sbca    X_WORD+1
                staa    VAR_SUM,x
        .ENDIF ENABLE                              ; re-enable interupts ldd     LATEST_V,x                  ; multiply voltage sample by 5
        lsld
        lsld
        addd    LATEST_V,x
        std     TEMP_STORE,x                ; save in temporary storage ldd     VR_SUM+10,x                 ; subtract from VR_SUM[5]
        subd    TEMP_STORE,x
        std     VR_SUM+10,x ldd     LATEST_V,x                  ; multiply voltage sample by 15
        lsld
        lsld
        lsld
        lsld
        subd    LATEST_V,x
        std     TEMP_STORE,x                ; save this in temp storage addd    VR_SUM+14,x                 ; add to VR_SUM[7]
        std     VR_SUM+14,x ldd     VR_SUM+12,x                 ; subtract from VR_SUM[6]
        subd    TEMP_STORE,x
        std     VR_SUM+12,x inc     SAMPLE_COUNT,x              ; increment sample count jmp     exit_calc1                  ; exit routine ; ------------- come here if sample count = ( 23 )

count23:
        ldd     LATEST_V,x                  ; multiply voltage sample by 3
        lsld
        addd    LATEST_V,x std     TEMP_STORE,x                ; store into temp storage clr     SIGN_FLAG,x                 ; clear sign flag ldd     VR_SUM+10,x                 ; subtract from VR_SUM[5]
        subd    TEMP_STORE,x                ; this finishes VR_SUM[5]
        std     VR_SUM+10,x                 ; store for debug ; ------------- if negative then make positive for multiply .IF MI                              ; if result is negative then make positi
                coma                        ; make 2's complement
```

```
                comb
                addd    #1
                com     SIGN_FLAG,x     ; set flag to indicate minus result
        .ENDIF ; ------------ multiply VR_SUM[5] * IR_SAVE[5] and add to VAR_SUM DISABLE                         ; disable interupts for multiply std     X_WORD
        ldab    IR_SAVE+5,x             ; get the saved I sample for vars calc
        clra
        std     Y_WORD                  ; multiply by VR_SUM[5]

.IF <PLUS,<SIGN_FLAG,x>>        ; check sign of VR_SUM ldd     VAR_SUM+1,x     ; add product into VAR_SUM
                addd    Y_WORD
                std     VAR_SUM+1,x
                ldaa    VAR_SUM,x
                adca    X_WORD+1
                staa    VAR_SUM,x
        .ELSE
                ldd     VAR_SUM+1,x     ; subtract product from VAR_SUM
                subd    Y_WORD
                std     VAR_SUM+1,x
                ldaa    VAR_SUM,x
                sbca    X_WORD+1
                staa    VAR_SUM,x
        .ENDIF ENABLE                          ; re-enable interupts ldd     LATEST_V,x              ; multiply voltage sample by 5
        lsld
        lsld
        addd    LATEST_V,x
        std     TEMP_STORE,x            ; save in temporary storage ldd     VR_SUM+12,x             ; subtract from VR_SUM[6]
        subd    TEMP_STORE,x
        std     VR_SUM+12,x ldd     LATEST_V,x              ; multiply voltage sample by 15
        lsld
        lsld
        lsld
        lsld
        subd    LATEST_V,x
        std     TEMP_STORE,x            ; save this in temp storage ldd     VR_SUM+14,x             ; subtract from VR_SUM[7]
        subd    TEMP_STORE,x
        std     VR_SUM+14,x inc     SAMPLE_COUNT,x          ; increment sample count jmp     exit_calc1              ; exit routine ; ------------ come here if sample count = ( 25 )

count25:
        ldd     LATEST_V,x              ; multiply voltage sample by 3
        lsld
        addd    LATEST_V,x std     TEMP_STORE,x            ; store into temp storage clr     SIGN_FLAG,x             ; clear sign flag ldd     VR_SUM+12,x             ; subtract from VR_SUM[6]
        subd    TEMP_STORE,x            ; this finishes VR_SUM[6]
        std     VR_SUM+12,x             ; store for debug
```

```
;  ------------ if negative then make positive for multiply

.IF MI                              ; if result is negative then make positi
                 coma                           ; make 2's complement
                 comb
                 addd    #1
                 com     SIGN_FLAG,x            ; set flag to indicate minus result _
            .ENDIF ;  ------------ multiply VR_SUM[6] * IR_SAVE[6] and add to VAR_SUM DISABLE                             ; disable interupts for multiply std     X_WORD
            ldab    IR_SAVE+6,x                 ; get the saved I sample for vars calc
            clra
            std     Y_WORD                      ; multiply by VR_SUM[6]

.IF <PLUS,<SIGN_FLAG,x>>            ; check sign of VR_SUM ldd     VAR_SUM+1,x            ; add product into VAR_SUM
                 addd    Y_WORD
                 std     VAR_SUM+1,x
                 ldaa    VAR_SUM,x
                 adca    X_WORD+1
                 staa    VAR_SUM,x
            .ELSE
                 ldd     VAR_SUM+1,x            ; subtract product from VAR_SUM
                 subd    Y_WORD
                 std     VAR_SUM+1,x
                 ldaa    VAR_SUM,x
                 sbca    X_WORD+1
                 staa    VAR_SUM,x
            .ENDIF ENABLE                              ; re-enable interupts ldd     LATEST_V,x                  ; multiply voltage sample by 5
            lsld
            lsld
            addd    LATEST_V,x
            std     TEMP_STORE,x                ; save in temporary storage ldd     VR_SUM+14,x                 ; subtract from VR_SUM[7]
            subd    TEMP_STORE,x
            std     VR_SUM+14,x inc     SAMPLE_COUNT,x              ; increment sample count jmp     exit_calc1                  ; exit routine ;  ------------ come here if sample count = ( 27 )

count27:
            ldd     LATEST_V,x                  ; multiply voltage sample by 3
            lsld
            addd    LATEST_V,x std     TEMP_STORE,x                ; store into temp storage clr     SIGN_FLAG,x                 ; clear sign flag ldd     VR_SUM+14,x                 ; subtract from VR_SUM[7]
            subd    TEMP_STORE,x                ; this finishes VR_SUM[7]
            std     VR_SUM+14,x                 ; store for debug ;  ------------ if negative then make positive for multiply .IF MI                              ; if result is negative then make positi
                 coma                           ; make 2's complement
```

```
                        comb
                        addd    #1
                        com     SIGN_FLAG,x         ; set flag to indicate minus result
                .ENDIF ; ------------- multiply VR_SUM[7] * IR_SAVE[7] and add to VAR_SUM DISABLE                             ; disable interupts for multiply std     X_WORD
                ldab    IR_SAVE+7,x                 ; get the saved I sample for vars calc
                clra
                std     Y_WORD                      ; multiply by VR_SUM[7]

.IF <PLUS,<SIGN_FLAG,x>>            ; check sign of VR_SUM ldd     VAR_SUM+1,x         ; add product into VAR_SUM
                        addd    Y_WORD
                        std     VAR_SUM+1,x
                        ldaa    VAR_SUM,x
                        adca    X_WORD+1
                        staa    VAR_SUM,x
                .ELSE
                        ldd     VAR_SUM+1,x         ; subtract product from VAR_SUM
                        subd    Y_WORD
                        std     VAR_SUM+1,x
                        ldaa    VAR_SUM,x
                        sbca    X_WORD+1
                        staa    VAR_SUM,x
                .ENDIF ENABLE                              ; re-enable interupts inc     SAMPLE_COUNT,x              ; increment sample count jmp     exit_calc1                  ; exit routine ; ------------- come here if sample count = ( 31 )

count31:

ldy     XFER_ADDRESS,x              ; load address of code to run from here jmp     0,y ; ------------- come here if running channel 1 code xfer1:
                ldab    TCNT+1                      ; add randomness to channel's sampling
                clra
                addd    TOC1
                std     TOC1 ldd     0,x
                std     calc_2_struct_1
                ldd     2,x
                std     calc_2_struct_1+2
                ldd     4,x
                std     calc_2_struct_1+4
                ldd     6,x
                std     calc_2_struct_1+6
                ldd     8,x
                std     calc_2_struct_1+8
                ldd     10,x
                std     calc_2_struct_1+10
                ldd     12,x
                std     calc_2_struct_1+12
                ldd     14,x
                std     calc_2_struct_1+14
                ldd     16,x
                std     calc_2_struct_1+16
                ldd     18,x
                std     calc_2_struct_1+18
                ldd     20,x
```

```
            std     calc_2_struct_1+20
            ldd     22,x
            std     calc_2_struct_1+22
            ldd     24,x
            std     calc_2_struct_1+24
            ldaa    26,x
            staa    calc_2_struct_1+26 ldaa    #TCB_PEND               ; post pend
            ldab    #CALC_2_TASK1           ; post it to calc_2 task ldy     #calc_2_struct_1 cont31:
            pshx
            pshy
            jsr     PostTask                ; post sums ready to calc_2 task
            puly
            pulx ; ------------- determine if we should try a lower range .IF <ZERO,<false_start,x>>,AND      ; if we didn't false start
            ldaa    sum2_count,y
        .IF <a,EQ,#MAX2_COUNT-1> ldab    i_range,x
            .IF NZ
                    decb                    ; increase range stab    I_RANGE,x       ; store new range number ldy     gain_table,x
                    aby                     ; index into lookup table ldaa    0,y             ; get new gain settings
                    staa    control,x       ; store new value of control byt
            .ENDIF
        .ENDIF
        .ENDIF clr     SAMPLE_COUNT,x          ; reset sample count to zero clr     false_start,x clr     schedule                ; we want to schedule jmp     exit_calc1              ; exit routine ; ------------- come here when we are in a nop cycle count_nop:
            inc     SAMPLE_COUNT,x          ; just increment sample count ; ------------- come here to exit calculation 1 routine exit_calc1:
            DISABLE ; ------------- re-enable sampling interrupt for this channel ldaa    int_mask,x
            oraa    TMSK1
            staa    TMSK1 dec     scheduling

.IF Z,AND
            .IF <ZERO,schedule>
```

```
            jmp     dispatch            ; if we want and can schedule then do
    .ENDIF rti                         ; else just exit ; ------------ sample index jump table calc_1_jumps:
        dw      count_even
        dw      count_nop
        dw      count_even
        dw      count3
        dw      count_even
        dw      count5
        dw      count_even
        dw      count7
        dw      count_even
        dw      count9
        dw      count_even
        dw      count11
        dw      count_even
        dw      count13
        dw      count_even
        dw      count15
        dw      count_even
        dw      count17
        dw      count_even
        dw      count19
        dw      count_even
        dw      count21
        dw      count_even
        dw      count23
        dw      count_even
        dw      count25
        dw      count_even
        dw      count27
        dw      count_even
        dw      count_nop
        dw      count_even
        dw      count31 gain_table1:
        db      01011000B               ; range 0, channel 1
        db      01011001B               ; range 1, channel 1
        db      01010000B               ; range 2, channel 1
        db      01010001B               ; range 3, channel 1
        db      01001000B               ; range 4, channel 1
        db      01001001B               ; range 5, channel 1
        db      01000000B               ; range 6, channel 1 gain_table2:
        db      01111000B               ; range 0, channel 2
        db      01111010B               ; range 1, channel 2
        db      01110000B               ; range 2, channel 2
        db      01110010B               ; range 3, channel 2
        db      01101000B               ; range 4, channel 2
        db      01101010B               ; range 5, channel 2
        db      01100000B               ; range 6, channel 2 gain_table3:
        db      00011000B               ; range 0, channel 3
        db      00011100B               ; range 1, channel 3
        db      00010000B               ; range 2, channel 3
        db      00010100B               ; range 3, channel 3
        db      00001000B               ; range 4, channel 3
        db      00001100B               ; range 5, channel 3
        db      00000000B               ; range 6, channel 3 calculate_1 ENDPROC end
```

```
$PAGINATE
$TITLE "calculate_2 routine"
$PAGEWIDTH 255
$MODNAME(calc2)

; -----------------------------------------------------------------------
; calculate_2:          This routine is tasker driven and when sums are
;                       ready for processing it is notified using the TCB_PEND
;                       flag.
;                       It takes the VAR_SUM from the calculate_1 routine
;                       and combines them into larger sums until these sums
;                       are full. It then copies them to the calculate 3
;                       locations and notifies the calculate 3 task.
;                       This routine's job is to create a suitable average
;                       vars sum. This vars sum still requires scaling
;                       to produce true average vars and vars-hours.
;                       This scaling is done by calculate 3 task.
; -----------------------------------------------------------------------

$INCLUDE "meter.cfg"
        $INCLUDE "..\include\control.h"
        $INCLUDE "..\include\kernel.inc"
        $INCLUDE "..\include\struc11.inc"
        $INCLUDE "..\include\macros.inc"

external        RunningTcb(page0)
        external        tcnt_ext(page0)
        external        Tcb0 external        gain_table1
        external        gain_table2
        external        gain_table3
        external        xfer1
        external        xfer2
        external        xfer3
        external        calc_1_struct_1
        external        calc_1_struct_2
        external        calc_1_struct_3
        external        calc_2_struct_1
        external        calc_2_struct_2
        external        calc_2_struct_3
        external        calc_3_struct_1
        external        calc_3_struct_2
        external        calc_3_struct_3
        external        conv_table external        power_sum
        external        v_dc_sum
        external        i_dc_sum
        external        v_rms_sum
        external        var_sum
        external        vr_rms_sum
        external        i_range
        external        start_time
        external        latest_v
        external        latest_i
        external        control
        external        xfer_address
        external        gain_table
        external        sample_count
        external        false_start
        external        int_mask
        external        orig_start_time external        power2_sum
        external        v_dc2_sum
        external        i_dc2_sum
        external        v_rms2_sum
        external        var2_sum
        external        vr_rms2_sum
        external        sum2_count
        external        i_range0
        external        prev_start_time
        external        done_flag external        LB_tword
        external        LB_float1
```

```
        external    LB_float2
        external    LB_float3
        external    LB_accum
        external    LB_count
        external    LBdc_power
        external    LB_Init
        external    DEF_KH
        external    DEF_KH_EXP
        external    power_minimum external    power3_sum
        external    v_dc3_sum
        external    i_dc3_sum
        external    v_rms3_sum
        external    var3_sum
        external    vr_rms3_sum
        external    i_range3
        external    sum3_count
        external    delta_time
        external    overrun_count external    calc_2_task1
        external    calc_2_task2
        external    calc_2_task3
        external    calc_3_task
        external    PendTask
        external    PostTask
        external    GetTaskID
        external    f_compare
        external    f_load
        external    f_store
        external    f_multiply
        external    f_divide
        external    f_add
        external    f_addext
        external    MAX2_COUNT $ALLPUBLIC

SEG DATA sign_extend      ds    1 calc2_coin       ds    1     ; used to randomize error

LBTime           ds    2
special_LBTime   ds    2
LB_power1        ds    3     ; store average light blink power for side A
LB_power2        ds    3     ; store average light blink power for side B
LB_power3        ds    3     ; store average light blink power for side C
LB_powert        ds    3     ; store average light blink power of total
LB_DeltaTime     ds    6     ; current estimate of time between blinks
LB_RealDelta     ds    3
LB_counter       ds    4
LB_StartTime     ds    3
LB_LEDcounter    ds    1

$NOALLPUBLIC

DEFSEG CODE2, class=CODE
        SEG CODE2

;GLOBALs are mandatory ;PUBLICs are optional - for debugging
        GLOBAL  calculate_2
        PUBLIC  calc_2_init,calc_2_loop,calc_2_loop2,calc_3_overrun
        PUBLIC  xfer_sums calculate_2 PROC calc_2_init:

; ------------ zero out variables in calc_2 and calc_3 structures ldaa    #0
        staa    sum2_count,x
        staa    done_flag,x
        staa    sum3_count,y
```

```
        staa    overrun_count           ; zero overrun count on every reset
        staa    overrun_count+1 staa    calc2_coin              ; set coin to zero

; ------------ main routine's loop begins here calc_2_loop:

; ------------ wait for sums pshx
        pshy
        ldab    #TCB_PEND
        ldy     #0
        jsr     PendTask
        puly
        pulx ; ------------ loop without pending
calc_2_loop2:

; ------------ if sum2_count = 0 then run this code

.IF <ZERO,<sum2_count,x>>,NEAR
                ldd     VAR_SUM+1,x             ; load var sum
                std     VAR2_SUM+2,x
                ldaa    VAR_SUM,x
                staa    VAR2_SUM+1,x lsla                            ; put sign into carry
                ldaa    #0
                sbca    #0
                staa    VAR2_SUM,x ldaa    i_range,x               ; start with new i_range
                staa    i_range0,x ; ------------ calculate total time of entire level 2 var sum
;              this will be used to calculate energy in level 3

.IF <ZERO,<false_start,x>>,OR   ; if we didn't false start
                .IF <ZERO,calc2_coin>           ; or we randomly select this
                        ldd     start_time+2,x          ; calculate delta time f
                        subd    prev_start_time+2,x     ; last sums
                        std     delta_time+2,y          ; store in calc_3 struct ldd     start_time,x
                        sbcb    prev_start_time+1,x
                        sbca    prev_start_time,x
                        std     delta_time,y            ; store in calc_3 struct ldd     start_time,x            ; store start time into
                        std     prev_start_time,x
                        ldd     start_time+2,x
                        std     prev_start_time+2,x .ELSE                                   ; if nonzero false start
                        ldd     orig_start_time+2,x     ; calculate delta time f
                        subd    prev_start_time+2,x     ; last sums
                        std     delta_time+2,y          ; store in calc_3 struct ldd     orig_start_time,x
                        sbcb    prev_start_time+1,x
                        sbca    prev_start_time,x
                        std     delta_time,y            ; store in calc_3 struct ldd     orig_start_time,x                 ; store start ti
                        std     prev_start_time,x
```

```
                ldd     orig_start_time+2,x
                std     prev_start_time+2,x
        .ENDIF com     calc2_coin              ; keep coin flipping
                pshx
                pshy ldaa    #TCB_PEND               ; post ready to calc_3
                ldab    #CALC_3_TASK
                jsr     PostTask puly
                pulx inc     sum2_count,x jmp     calc_2_loop

.ENDIF

; ------------- if done_flag not zero or if we changed ranges then end sums

.IF <NONZERO,<done_flag,x>>,OR
        .IF <NONZERO,<false_start,x>>
                jsr     xfer_sums               ; transfer to calc_3 sums
                clr     sum2_count,x            ; reset sum2 count
                clr     done_flag,x             ; reset done flag
                jmp     calc_2_loop2            ; loop without pending
        .ENDIF ; ------------- add new sums #1 to sums #2

DISABLE                                 ; prevent confusion of sign extend byte
        clr     sign_extend .IF <MINUS,<var_sum,x>>
                com     sign_extend
        .ENDIF ldd     VAR2_SUM+2,x                    ; add to var2 sum
        addd    VAR_SUM+1,x
        std     VAR2_SUM+2,x ldd     VAR2_SUM,x
        adcb    VAR_SUM,x
        adca    sign_extend
        std     VAR2_SUM,x
        ENABLE ldaa    sum2_count,x
        inca
        staa    sum2_count,x                    ; increment sum2 count ; ----------- if sum2_count = max then set done flag .IF <a,EQ,#MAX2_COUNT>
                bset    done_flag,x,0ffh
        .ENDIF jmp     calc_2_loop                     ; go wait for more sums ; ------------- this code converts the calc_2 sums into calc_3 sums xfer_sums:
        .IF <NONZERO,<sum3_count,y>>
calc_3_overrun:
                ldd     overrun_count           ; increment overrun count
                addd    #1
```

```
                std     overrun_count
        .ENDIF ldd     var2_sum,x              ; transfer var2 sum
        std     var3_sum,y
        ldd     var2_sum+2,x
        std     var3_sum+2,y ldaa    i_range0,x
        staa    i_range3,y ldaa    sum2_count,x            ; signal data ready togo
        staa    sum3_count,y rts calculate_2     ENDPROC end $PAGINATE
$TITLE "calculate_3 routine"
$PAGEWIDTH 255
$MODNAME(calc3)

; ----------------------------------------------------------------------
; calculate_3:      This routine is tasker driven and when sums are
;                   ready for processing it is notified using the TCB_PEND
;                   flag by the calculate_2 routine.
;                   It takes the sums from the calculate_2 routine
;                   and converts them into floating point values.
;                   It then multiplies them by scale factors and stores
;                   the results into the appropriate metering registers.
;                   It also takes the scaled average and multiplies it
;                   by the time over which the samples were taken to get
;                   the energy.  In this case it would be kilovolt-amp react
;                   hours.
; ----------------------------------------------------------------------

$INCLUDE "meter.cfg"
        $INCLUDE "..\include\control.h"
        $INCLUDE "..\include\kernel.inc"
        $INCLUDE "..\include\struc11.inc"
        $INCLUDE "..\include\regs.inc"

external        RunningTcb(page0)
        external        tcnt_extra(page0)
        external        tcnt_ext(page0)

external        gain_table1
        external        gain_table2
        external        gain_table3
        external        xfer1
        external        xfer2
        external        xfer3
        external        calc_1_struct_1
        external        calc_1_struct_2
        external        calc_1_struct_3
        external        calc_2_struct_1
        external        calc_2_struct_2
        external        calc_2_struct_3
        external        calc_3_struct_1
        external        calc_3_struct_2
        external        calc_3_struct_3
        external        calc3_work_1
        external        calc3_work_2
        external        calc3_work_3
        external        DemandStart
        external        DemandTest_status external        power3_sum
        external        v_dc3_sum
        external        i_dc3_sum
        external        v_rms3_sum
        external        var3_sum
```

| | |
|---|---|
| external | vr_rms3_sum |
| external | i_range3 |
| external | sum3_count |
| external | delta_time |
| external | timeslice |
| | |
| external | kwhrs_af_temp |
| external | kwhrs_ar_temp |
| external | kvhrs_af_temp |
| external | kvhrs_ar_temp |
| | |
| external | kwhrs_bf_temp |
| external | kwhrs_br_temp |
| external | kvhrs_bf_temp |
| external | kvhrs_br_temp |
| | |
| external | kwhrs_cf_temp |
| external | kwhrs_cr_temp |
| external | kvhrs_cf_temp |
| external | kvhrs_cr_temp |
| | |
| external | energy_crc |
| external | ee_energy_crc |
| external | energy_regs |
| external | temp_energy_regs |
| external | ee_energy_regs |
| external | conv_table |
| external | voltage_factors |
| external | ee_conv_table |
| external | ee_factor_crc |
| external | rom_conv_table |
| external | rom_voltage_factors |
| external | i_scaler |
| external | v_scaler |
| external | vscale_set_flag |
| external | iscale_set_flag |
| external | switchopen |
| external | switchtrip |
| | |
| external | calib_mode |
| external | calib_a_table |
| external | calib_b_table |
| external | calib_c_table |
| external | calib_table_size |
| external | calib_maxv_cnt |
| external | calib_a_cnt |
| external | calib_b_cnt |
| external | calib_c_cnt |
| external | calib_display |
| | |
| external | comp_to_peak4 |
| external | crc_energy |
| external | PendTask |
| external | PostTask |
| external | crc |
| external | string_copy |
| external | string_zero |
| external | meter_test_init |
| external | DemandTest_Calc |
| external | dmultiply |
| external | make_mod_100k |
| external | WrEEprom |
| | |
| external | f_load |
| external | f_store |
| external | f_multiply |
| external | f_divide |
| external | f_add |
| external | f_sqrt |
| external | f_compare |
| | |
| external | MAX2_COUNT |
| external | METER_CALIBRATED |
| external | LOST_KWHRS |
| external | METER_UNGND |

```
        external        sidea_range
        external        sideb_range
        external        sidec_range
        external        meter_status
        external        ee_meter_status
        external        calc_3_struct_size $ALLPUBLIC

SEG DATA calc3_tword          ds      6
calc3_tword2         ds      6
calc3_farg1          ds      3
calc3_farg2          ds      3
calc3_farg3          ds      3
calc3_farg4          ds      3
calc3_farg5          ds      12              ; leave room for sqrt scratch calc3_power          ds      4
calc3_voltage        ds      3
calc3_vars           ds      4
calc3_va             ds      4
calc3_reactive_v     ds      3
calc3_pf             ds      3
calc3_i              ds      3 calc3_energy         ds      4
calc3_reactive_e     ds      4 calc3_psflag         ds      1
calc3_varsflag       ds      1
calc3_overflow       ds      1
calc3_channel        ds      1
calc3_range          ds      1
calc3_status         ds      1               ; used to tell when valid number energy_time          ds      3               ; timestamp of last total energy
                                             ; update using tcnt_ext word calc3_v_sums    ds   (8+3)*phases_installed  ; sums and counts of voltages s:
calc3_i_sums    ds   (8+3)*phases_installed  ; sums and counts of currents s:

calc3_scaleflag ds   1
working_vscale  ds   6
working_pscale  ds   3
$NOALLPUBLIC DEFSEG CALC3,class=CODE
        SEG CALC3

;GLOBALs are mandatory ;PUBLICs are optional - for debugging.
        GLOBAL  calculate_3,handle_cal, rom_set_flag
        PUBLIC  calc_3_init,calc_3_loop,convert_sums,compute_values
        PUBLIC  power_minimum,vars_minimum,calc_total_energy calculate_3 PROC ; ------------ initialize routine calc_3_init:

; ------------ main routine's loop begins here calc_3_loop:

; ------------ wait for sums ldab    #TCB_PEND
        ldy     #0
        jsr     PendTask
```

; ------------ test the various calc_3 structures for nonzero sum3_counts calc_3_loop2:
        DISABLE ; ------------ if structure for channel 1 is ready then process ldy     #calc_3_struct_1
        .IF     <NONZERO,<sum3_count,y>>,NEAR
                ENABLE ldx     #calc3_work_1           ; copy sums to private work area
                ldab    #calc_3_struct_size
                jsr     string_copy clr     calc_3_struct_1+sum3_count      ; signal space available ldx     #calc3_work_1
                jsr     convert_sums            ; convert sums into AC floating ldaa    #0                      ; load channel-1 for indexing
                staa    calc3_channel ldaa    i_range3,x              ; load current range in convenie
                staa    calc3_range jsr     compute_values          ; compute real values ; ------------ add delta Kvar-hours of new sum to sum of total reactive energy ldy     #calc3_reactive_e
                ldx     #kvhrs_t
                jsr     add_delta_energy
        .ENDIF jmp     calc_3_loop                     ; wait for more sums ; --------------------------------------------------------------------
; convert sums into floating point averages
; -------------------------------------------------------------------- convert_sums:

; ------------ compute unscaled average VARS by dividing sum by number of sample clr     calc3_varsflag          ; clear var sflag ldd     #0
        std     calc3_tword
        ldd     var3_sum+2,x
        std     calc3_tword+4
        ldd     var3_sum,x
        std     calc3_tword+2

; ------------ invert vars and record sign change if negative

.IF     MI
                ldd     #0
                subd    calc3_tword+4
                std     calc3_tword+4 ldd     #0
                sbcb    calc3_tword+3
                sbca    calc3_tword+2
                std     calc3_tword+2 ldd     #0
                sbcb    #0ffh

```
            sbca    #0ffh
            std     calc3_tword com     calc3_varsflag          ; set flag to negative
    .ENDIF pshx
            ldx     #calc3_tword
            ldy     #calc3_farg1 jsr     f_load                  ; convert sum to floating point

; ------------ divide sum by number of instantaneous vars products in sum ldd     calc3_farg4             ; put sum3 count into farg2
            std     calc3_farg2
            ldaa    calc3_farg4+2
            staa    calc3_farg2+2 ldx     #calc3_farg1
            ldy     #calc3_vars             ; store into calc3 vars jsr     f_divide                ; get averge vars pulx rts ; ----------------------------------------------------------------------
; compute scaled values Kvars
; ---------------------------------------------------------------------- compute_values:

pshx

; ------------ multiply vars by 1 / hilbert transform scale factor
; compute hilbert filter gain at 60 hz or w = 2*pi*60/sample_freq = 2*pi*60/960
; note hilbert filter gain = 15*2*sin(w) + 5*2*sin(3*w) + 3*2*sin(5*w)
; therefore gain = 26.2626 , so 1 / gain = .038077 ldd     calc3_vars
            std     calc3_farg1
            ldaa    calc3_vars+2
            staa    calc3_farg1+2 ldd     #9bf7h                  ; load 1 / gain in floating point
            std     calc3_farg2
            ldaa    #128-20
            staa    calc3_farg2+2 ldx     #calc3_farg1
            ldy     #calc3_farg1 jsr     f_multiply

; ------------ get scale factor for Kvars due to hardware ldy     #conv_table ldab    calc3_channel           ; first index by channel
            ldaa    #21                     ; 7 ranges * 3 bytes / factor
            mul
            aby
            ldab    calc3_range             ; get index for power and var scale factors
            lslb                            ; multiply by 3
            addb    calc3_range
            aby ldd     0,y
            std     calc3_farg2             ; put vars scale factor in farg1
            ldaa    2,y
            staa    calc3_farg2+2
```

```
        ldx     #calc3_farg1
        ldy     #calc3_vars             ; store real scaled average Kvars jsr     f_multiply ; ------------ if Kvars is less than threshold then set to zero ldx     #calc3_vars
        ldy     #vars_minimum jsr     f_compare .IF CS                          ; if less than .005 Kvars then set to 0
        ldd     #0                      ; this prevents creep at 0 input
        std     calc3_vars
        staa    calc3_vars+2
        .ENDIF ; ------------ multiply Kvars by delta_time and conversion factor to get kilovar pulx
        pshx ldd     delta_time+2,x          ; convert delta_time to floating point
        std     calc3_tword+4
        ldd     delta_time,x
        std     calc3_tword+2
        ldd     #0
        std     calc3_tword ldx     #calc3_tword
        ldy     #calc3_farg2 jsr     f_load ldd     calc3_vars
        std     calc3_farg1
        ldaa    calc3_vars+2
        staa    calc3_farg1+2 ldx     #calc3_farg1
        ldy     #calc3_farg1 jsr     f_multiply
; ------------ multiply by magic number to get kvar-hours
;               this is due to delta time being in hardware ticks instead of hou ;note: constant = 1/7.2e+9 or 1.38888888888888e-10 ldd     #39094
        std     calc3_farg2
        ldaa    #128-48
        staa    calc3_farg2+2 ldx     #calc3_farg2
        ldy     #calc3_reactive_e jsr     f_multiply

; ------------ convert Kvar-hours back to fixed point

;note: we assume we always have less than 1 kvar-hour ldaa    calc3_reactive_e+2      ; make fraction have 4 bytes
        adda    #32
        staa    calc3_reactive_e+2 ldx     #calc3_reactive_e
        ldy     #calc3_tword jsr     f_store ldd     calc3_tword+2
        std     calc3_reactive_e
        ldd     calc3_tword+4
        std     calc3_reactive_e+2
```

```
;------------ convert average Kvars back to fixed point ldaa    calc3_vars+2        ; multiply by 2^16 to have 2 bytes of
        adda    #16                 ; fraction
        staa    calc3_vars+2 ldx     #calc3_vars
        ldy     #calc3_tword jsr     f_store

;------------ if vars was negative make calc3_dword minus before we store

.IF <MINUS,calc3_varsflag>
            ldd     #0
            subd    calc3_tword+4
            std     calc3_tword+4 ldd     #0
            sbcb    calc3_tword+3
            sbca    calc3_tword+2
            std     calc3_tword+2
        .ENDIF ldd     calc3_tword+2
        std     calc3_vars
        ldd     calc3_tword+4
        std     calc3_vars+2 pulx rts

;-------------------------------------------------------------------------
; minimum power and var levels detectable in KW and KVARS
;------------------------------------------------------------------------- vars_minimum:
        dw      0a3d7h              ; .005 KVARS
        db      128-23 calculate_3  ENDPROC

;-------------------------------------------------------------------------
; Add new delta energy to total energy register.
;------------------------------------------------------------------------- add_delta_energy PROC ldd     5,x                 ; add new energy to temp register
        addd    2,y
        std     5,x
        ldd     3,x
        adcb    1,y
        adca    0,y
        std     3,x
        ldd     1,x
        adcb    #0
        adca    #0
        std     1,x
        ldaa    0,x
        adca    #0
        staa    0,x jsr     make_mod_100k       ; make modulus 100 thousand rts add_delta_energy ENDPROC end
```

What is claimed is:

1. A method for measuring reactive power in an electrical load in an electrical system, said method comprising the steps of:
    electromagnetically coupling a voltage probe across the electrical load;
    electromagnetically coupling a current probe to the electrical load;
    measuring a time-varying voltage across the electrical load using said voltage probe, said voltage probe outputting a voltage signal representing said time-varying voltage;
    measuring a time-varying current flowing through the electrical load using said current probe, said current probe outputting a current signal representing said time-varying current;
    sampling substantially simultaneously and instantaneously said voltage signal and said current signal at a sampling frequency to produce a plurality of voltage samples representative of said voltage signal and a plurality of current samples representative of said current signal;
    shifting the phase of frequency components of said plurality of voltage samples by −90° C. relative to said plurality of current samples for substantially all frequency components having a frequency less than one-half of said sampling frequency to produce a plurality of quadrature voltage samples; and
    multiplying each sample of said plurality of quadrature voltage samples by each corresponding sample of said plurality of current samples to produce a plurality of reactive power samples, each of which is a measure of instantaneous reactive power in the electrical load.

2. A method according to claim 1, further comprising the steps of:
    averaging said plurality of reactive power samples to obtain a value proportional to average reactive power in the electrical load; and
    providing said value proportional to average reactive power to an output utilization device.

3. A method according to claim 2, wherein said sampling step comprising sampling over a period of at least one cycle of a fundamental frequency of interest and at least one quarter cycle prior to and at least one quarter cycle following a period of interest.

4. A method according to claim 1, wherein said sampling step comprises sampling over a period of at least one cycle of a fundamental frequency of interest.

5. A method according to claim 1, further comprising the steps of:
    normalizing at least one of said plurality of reactive power samples to obtain a calibrated value for instantaneous reactive power in the electrical load; and
    providing said calibrated value for instantaneous reactive power to an output utilization device.

6. A method according to claim 1, wherein the step of sampling substantially simultaneously instantaneous voltage and instantaneous current is done over a period of at least one cycle of a fundamental frequency of interest and at least one quarter cycle prior to and at least one quarter cycle following a period of interest.

7. A method according to claim 1, wherein at least one said voltage signal and said current signal is not purely sinusoidal in amplitude.

8. A method according to claim 1, further comprising the step of providing said measures of instantaneous reactive power to an output utilization device.

9. A meter for measuring reactive power in an electrical load in an electrical system, comprising:
    a voltage probe electromagnetically coupled across the electrical load, for measuring a time-varying voltage across the electrical load, wherein said voltage probe outputs a voltage signal representing said time-varying voltage;
    a current probe electromagnetically coupled to the electrical load, for measuring a time-varying current flowing through the electrical load, wherein said current probe outputs a current signal representing said time-varying current;
    sampling means coupled to said voltage probe and to said current probe, for sampling substantially simultaneously and instantaneously said voltage signal and said current signal at a sampling frequency to produce a plurality of voltage samples and a plurality of current samples;
    shifting means coupled to said sampling means, for shifting the phase of frequency components of said plurality of voltage samples provided to said shifting means by said sampling means by −90° C. relative to said plurality of current samples for substantially all frequency components having a frequency less than one-half said sampling frequency, to produce a plurality of quadrature voltage samples; and
    combining means coupled to said sampling means and said shifting means, for multiplying each of said plurality of quadrature voltage samples provided to said combining means by said shifting means by each corresponding sample of said plurality of current samples provided to said combining means by said sampling means to produce a plurality of reactive power samples, each of which is a measure of instantaneous reactive power in the electrical load.

10. A meter according to claim 9, further comprising:
    averaging means coupled to said combining means for averaging said plurality of reactive power samples provided to said averaging means by said combining means to obtain a value proportional to average reactive power in the electrical load;
    scaling means coupled to receive said value from said averaging means, said scaling means for multiplying said value by an inverse of said sampling frequency to produce a VAR-hours value representing the number of VAR-hours of reactive power in the electrical load; and
    an output utilization device coupled to said scaling means, wherein said scaling means outputs said number of VAR-hours to said output utilization device.

11. A meter according to claim 10, wherein said output utilization device records said number of VAR-hours for utility service billing purposes, and wherein said power meter is located proximate the electrical load.

12. A meter according to claim 9, further comprising:
    averaging means coupled to said combining means for averaging said plurality of reactive power samples provided to said averaging means by said combining means to obtain a value proportional to average reactive power in the electrical load; and an output utilization device coupled to said averaging means, wherein said averaging means outputs said value proportional to average reactive power to said output utilization device.

13. A meter according to claim 9, wherein said shifting means is a digital filter with a transfer function which is a digital approximation of a Hilbert transform.

14. A meter according to claim 9, wherein at least one of said voltage signal and said current signal is not purely sinusoidal in amplitude.

15. A meter according to claim 9, further comprising an output utilization device coupled to said combining means, wherein said combining means outputs said measures of instantaneous reactive power to said output utilization device.

16. A meter according to claim 9, wherein said meter is implemented using a digital signal processor.

17. A meter for measuring reactive power in an electrical load in an electrical system, comprising:
 a voltage probe electromagnetically coupled across the electrical load, for measuring a time-varying voltage across the electrical load, wherein said voltage probe outputs a voltage signal representing said time-varying voltage;
 a current probe electromagnetically coupled to the electrical load, for measuring a time-varying current flowing through the electrical load, wherein said current probe outputs a current signal representing said time-varying current;
 a sampling circuit coupled to said voltage probe and said current probe, said sampling circuit sampling substantially simultaneously and instantaneously said voltage signal and said current signal at a sampling frequency to produce a plurality of voltage samples and a plurality of current samples;
 a shifter coupled to said sampling means, said shifter shifting the phase of frequency components of said plurality of voltage samples provided to said shifter by said sampling means by −90° relative to said plurality of current samples for substantially all frequency components having a frequency less than one-half said sampling frequency, to produce a plurality of quadrature voltage samples; and
 a multiplier coupled to said sampling circuit and said shifter, said multiplier multiplying each of said plurality of quadrature voltage samples provided to said multiplier by said shifter by each corresponding sample of said plurality of current samples provided to said multiplier by said sampling circuit to produce a plurality of reactive power samples, each of which is a measure of instantaneous reactive power in the electrical load.

18. A meter according to claim 17, further comprising:
 averaging means coupled to said multiplier for averaging said plurality of reactive power samples provided to said averaging means by said multiplier to obtain a value proportional to average reactive power in the electrical load; and
 an output utilization device coupled to said averaging means, wherein said averaging means outputs said value proportional to average reactive power to said output utilization device.

19. A meter according to claim 17, further comprising:
 averaging means coupled to said multiplier for averaging said plurality of reactive power samples provided to said averaging means by said multiplier to obtain a value proportional to average reactive power in the electrical load;
 scaling means coupled to receive said value from said averaging means, said scaling means for multiplying said value by an inverse of said sampling frequency to produce a VAR-hours value representing the number of VAR-hours of reactive power in the electrical load; and
 an output utilization device coupled to said scaling means, wherein said scaling means outputs said number of VAR-hours to said output utilization device.

20. A meter according to claim 17, wherein said shifter is a digital filter with a transfer function which is a digital approximation of a Hilbert transform.

21. A meter according to claim 17, wherein at least one of said voltage signal and said current signal is not purely sinusoidal in amplitude.

22. A meter according to claim 17, further comprising an output utilization device coupled to said multiplier, wherein said multiplier outputs measures of instantaneous reactive power to said output utilization device.

* * * * *